United States Patent [19]

Tanaka

[11] Patent Number: 4,803,662
[45] Date of Patent: Feb. 7, 1989

[54] EEPROM CELL
[75] Inventor: Kenichi Tanaka, Nara, Japan
[73] Assignee: Sharp Kabushiki Kaisha, Osaka, Japan
[21] Appl. No.: 896,719
[22] Filed: Aug. 15, 1986
[30] Foreign Application Priority Data Oct. 21, 1985 [JP]  Japan ............................... 60-235946

[51] Int. Cl.$^4$ ............................................. G11C 11/40
[52] U.S. Cl. .................................... 365/185; 365/189
[58] Field of Search ................ 365/185, 189, 230, 154

[56] References Cited
U.S. PATENT DOCUMENTS
4,467,451 8/1984 Moyer .................................. 365/185

Primary Examiner—Terrell W. Fears
Attorney, Agent, or Firm—Flehr, Hohbach, Test, Albritton & Herbert

[57] ABSTRACT

An EEPROM cell for a memory device comprises a pair of bit lines each including a floating-gate MOS transistor such that a selected one of the transistors can be charged while the other is in uncharged condition by applying a higher voltage to a corresponding one of the bit lines and a lower voltage to the other bit line. Information stored in such a cell can thus be rewritten simply by applying a high voltage to one of the pair of its bit lines without carrying out a time-consuming ERASE mode of operation.

9 Claims, 2 Drawing Sheets

EEPROM CELL

BACKGROUND OF THE INVENTION

This invention relates to an EEPROM (electrically erasable and programmable ROM) cell using floating-gate MOS transistors and in particular to an EEPROM cell which does not require the ERASE mode of operation.

In a conventional memory device with EEPROM cells using floating-gate transistors, the ON and OFF conditions of each cell correspond to the charged or uncharged condition of its floating gate. Before entering any data to such a memory device, the user must carry out a so-called ERASE operation and set all memory cells in OFF (or ON) conditions and thereafter a so-called WRITE operation is performed whereby the charge conditions of the floating-gates are selectively changed. An example of such ERASE and WRITE operations will be explained below by way of FIG. 4.

FIG. 4 shows an example of conventional cell configuration with bit lines 3, 4 and 5 containing word select transistors 1 having their gates connected in common to a word line (select gate) 2 and a row of memory transistors 6 having their control gates 7 connected in common and their floating-gates shown at 8, 9 and 10. With a cell configuration of this type, an ERASE operation must be performed before each time new information is written in. In the case of the example shown in FIG. 4, this is achieved by applying a high voltage to the control gate 7. Electrons then flow into the floating-gates 8, 9 and 10 from the substrates through thin insulative layers such that all memory cells will be in charged conditions, or in OFF conditions. Thereafter, a high voltage is applied to the select gate 2 to select specified addresses, voltage at the control gate 7 is lowered, and then a high voltage is applied to a bit line 3, 4 or 5, causing electrons to be released from the corresponding floating gate 8, 9 or 10 to the substrate.

In summary, both the ERASE and WRITE modes of operation are required when the content of a conventional memory device of the type shown in FIG. 4 is changed (or rewritten). This means that it takes a relatively long time to rewrite the content of the memory device and such devices require complicated external circuits.

SUMMARY OF THE INVENTION

It is therefore an object of the present invention in view of the above to provide an EEPROM cell for a memory device which does not require an ERASE mode of operation.

It is another object of the present invention to provide an EEPROM cell for a memory device with which the time required for changing (rewriting) the content of the memory can be reduced.

It is still another object of the present invention to provide an EEPROM cell which can be simply operated.

The above and other objects of the present invention are achieved by using a pair of floating-gate MOS transistors such that distinction between data "0" and "1" is made on the basis of which one of the two floating-gates is in charged condition. A pair of bit lines corresponds to these transistors and one of them is selected for application of a high voltage according to the information to be stored in the memory device.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings.

DETAILED DESCRIPTION OF THE INVENTION

Figure 1:
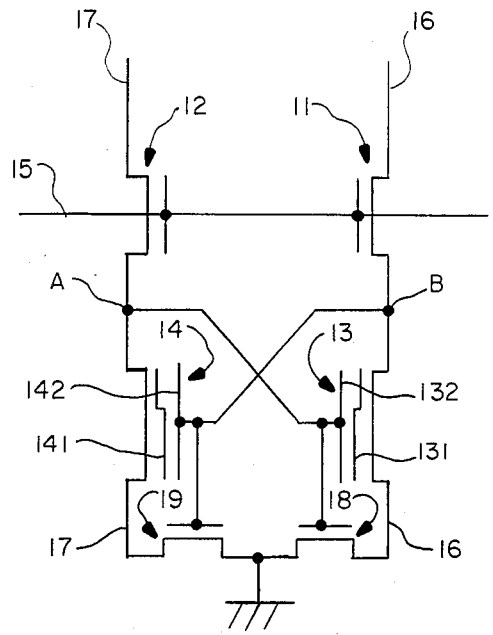
FIG. 1 is a circuit diagram of a memory cell according to an embodiment of the present invention.

FIG. 1 is a circuit diagram of an EEPROM cell embodying the present invention. As shown therein, the cell has a generally symmetrical structure. A pair of bit lines (hereinafter referred to as the first bit line 16 and the second bit line 17) respectively includes a first select transistor 11 and a second select transistor 12 with their gates connected in common to a word line (select gate) 15. As will be explained below, the bit lines 16 and 17 are herein considered to form a pair in the sense that a high voltage is applied to one of them when a low voltage is applied to the other. The bit lines 16 and 17 further include respectively a first memory MOS transistor 13 with a floating-gate 131 and a control gate 132 and a second memory MOS transistor 14 of the same type (P or N) with a floating-gate 141 and a control gate 142. The source of the first select transistor 11 is connected through a node B on the first bit line 16 both to the drain of the first memory transistor 13 and to the control gate 142 of the second memory transistor 14. Likewise, the source of the second select transistor 12 is connected through a node A on the second bit line 17 both to the drain of the second memory transistor 14 and to the control gate 132 of the first memory transistor 13. The control gates 132 and 142 of the first and second memory transistors 13 and 14 are connected respectively to the gates of first and second cut-off transistors 18 and 19 which are inserted respectively in the first and second bit lines 16 and 17. The source of the first memory transistor 13 is connected to the drain of the first cut-off transistor 18, the source of the second memory transistor 14 is likewise connected to the drain of the second cut-off transistor 19, and the sources of the two cut-off transistors 18 and 19 are grounded together.

The cell of FIG. 1 is considered to store the signal "1" when the first memory transistor 13 is in uncharged condition and the second memory transistor 14 is in charged condition. It is considered to store the signal "0" when the first memory transistor 13 is in charged condition and the second memory transistor 14 is in uncharged condition. When it is desired to store (or to write) "1" in the cell, a high voltage is applied first to the word line 15. Next, a high voltage is applied to the first bit line 16 and a low voltage to the second bit line 17. This raises the potential of control gate 142 of the second memory transistor 14 and causes electrons to flow from the transistor's substrate into its floating-gate, that is, the second memory transistor 14 becomes charged. In the meantime, since the potential of the control gate 132 of the first memory transistor is low, electrons flow out of its floating-gate 131 through the thin oxide film surrounding it to the second bit line 16. This leaves the first memory transistor 13 in uncharged condition as desired.

To read this memory cell, a read voltage is applied to the word line 15 to switch on the select transistors 11 and 12. If "1" is stored as described above, potential goes up at the node B and drops at the node A because the first memory transistor 13 is then in transmissive condition and the second memory transistor 14 in non-transmissive condition. As a result, potential drops on the first bit line 16 and goes up on the second bit line 17. The signal stored in the cell (that is, "1") is read by detecting this potential difference.

When it is desired to store the signal "0" in the cell, a high voltage is applied first as before to the word line 15 to activate the cell. This time, a low voltage is applied to the first bit line 16 and a high voltage is applied to the second bit line 17. As can be seen easily from the symmetrical structure of the cell, the bit lines and the transistors inserted therein function in reverse ways as compared to the situation explained above for the writing of "1". Thus, the first memory transistor 13 becomes charged and the second memory transistor 14 becomes uncharged. This, by definition, means that the signal "0" has been stored. When one wishes to read the cell having "0" stored therein and applies a read voltage to the word line 15, the voltage relationship between the bit lines 16 and 17 is also reversed and this reversed potential difference will be detected to identify the nature of the signal stored (that is, "0"). In summary, the content (or the stored information) of a memory cell according to the present invention can be rewritten merely by applying a high voltage to one of a pair of bit lines, and hence there is no need for the ERASE mode of operation.

Figure 2:
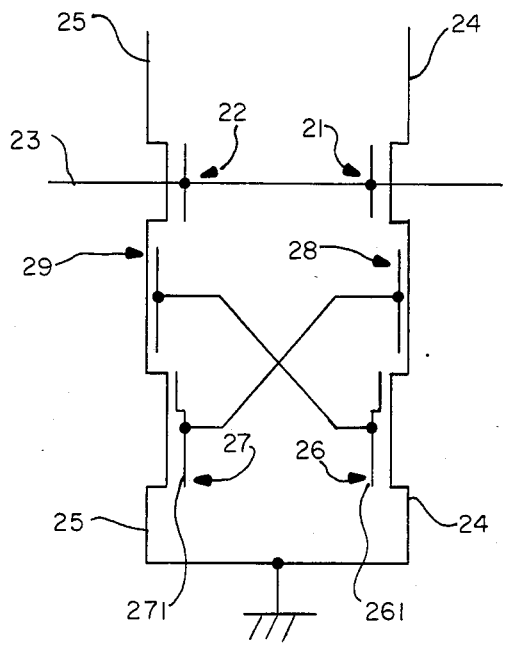
FIG. 2 is a circuit diagram of a memory cell according to another embodiment of the present invention.

The present invention was explained above by way of an example with two-level polysilicon gate structure but this is not intended to limit the scope of the present invention. It goes without saying that the objects of the present invention can be achieved with memory cells with one-level gate structure or three-level gate structure. FIG. 2 shows an EEPROM cell according to another embodiment of the invention with one-level gate structure which comprises first and second select transistors 21 and 22 with their gates (select gates) connected to a word line 23 and a pair of bit lines (first and second bit lines 24 and 25) respectively including first and second memory transistors 26 and 27 respectively having floating-gates 261 and 271. First and second capacitances 28 and 29 are formed as shown respectively between the source of the first select transistor 21 and the drain of the first memory transistor 26 and between the source of the second select transistor 22 and the drain of the second memory transistor 27. The floating-gate 261 of the first memory transistor 26 is thus controlled by the potential of the second capacitance 29 built on the second bit line 25 and the floating gate 271 of the second memory transistor 27 is controlled by the potential of the first capacitance 28 built on the first bit line 24. Signals "0" and "1" are written in and read from this memory cell in the same ways as explained above with respect to the memory cell of FIG. 1.

Figure 3:
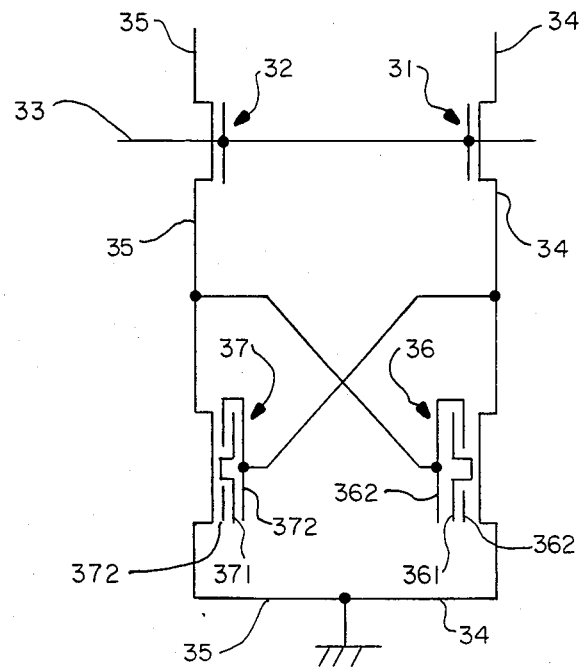
FIG. 3 is a circuit diagram of a memory cell according to still another embodiment of the present invention.

FIG. 3 shows a memory cell according to still another embodiment of the present invention with three-level gate structure. This cell is similar to the cell explained by way of FIG. 1 and comprises a pair of bit lines 34 and 35 including select transistors 31 and 32 the gates of which are connected in common to a word line 33 and memory transistors 36 and 37 each with a floating gate 361 or 371 and a control gate 362 of 372 in three-level structure. As shown in FIG. 3, the second polysilicon layer serves as a floating gate sandwiched between the first and third polysilicon layers which serve as a control gate. Since the capacitance between polysilicon layers can be increased, improved WRITE/ERASE characteristics can be obtained with three-level gate structure. The third polysilicon layer may be used for wiring purposes to reduce the overall size of the cell.

The cut-off transistors of FIG. 1 serve the purpose of cutting off unwanted current at the time of WRITE and ERASE. When the second bit line 17 is at a higher voltage than the first bit line 16, for example, the voltage at the gate of the first cut-off transistor 18 becomes high through the node A. Since the first bit line 16 is at low voltage in this case, however, there is no current to its grounded source. With respect to the second cut-off transistor 19, voltage at its gate becomes low through the node B. In other words, the second cut-off transistor 19 is in the OFF condition and no current flows to its source even if a voltage is applied to its drain. At the time of reading, if the first memory transistor 13 is OFF and the second memory transistor 14 is ON, for example, the node B should be high and the node A should be low but the voltage at the gate of the first cut-off transistor 18 is low and the voltage at the gate of the second cut-off transistor 19 is high. The second bit line 17 is then transmissive while the first bit line 16 is non-transmissive. The cut-off transistors serve to reduce the charge inside an LSI chip and allow reduction of chip size. Cut-off transistors are not disclosed in FIGS. 2 and 3. Thus, the current consumption will increase in these cases. In order to reduce current consumption, cut-off transistors should be included as disclosed in FIG. 1.

Figure 4:
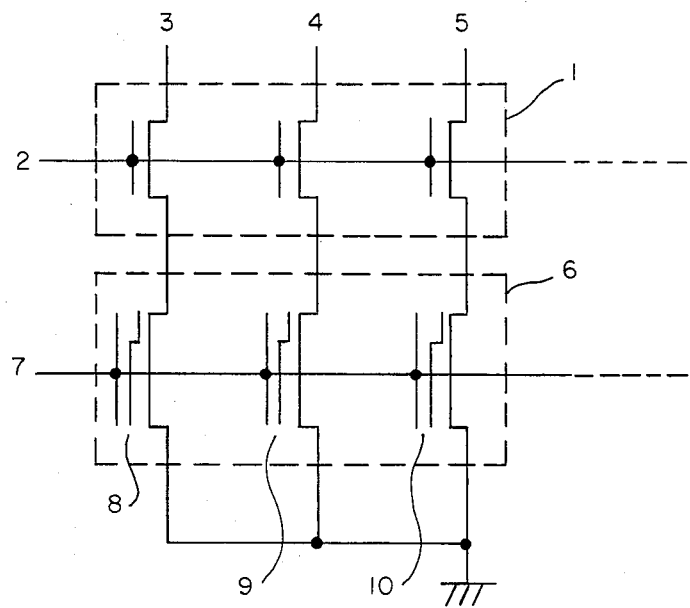
FIG. 4 is a circuit diagram of a prior art memory cell.

The foregoing description of preferred embodiments of the present invention has been presented for purposes of illustration and description. It is not intended to be exhaustive or to limit the invention to the precise form disclosed, and many modifications and variations are possible in light of the above teaching. In summary, a memory device of the present invention requires no time-consuming operation in an ERASE mode unlike the conventional memory device as shown in FIG. 4 which comprises unit cells connected in common to a single ERASE/WRITE line. To read from a conventional memory device, the current in each cell must be compared with a fixed sense level but the user of a device according to the present invention needs only to detect the potential difference between the two bit lines. Modifications and variations which may be apparent to a person skilled in the art are intended to be included within the scope of this invention.

What is claimed is:

1. An EEPROM cell for a memory device comprising
   a pair of floating-gate transistors consisting of a first memory transistor and a second memory transistor, and
   a pair of bit lines consisting of a first bit line corresponding to said first memory transistor and a second bit line corresponding to said second memory transistor,
   each of said floating-gate transistors having a floating gate and a control gate, the floating gate of said first floating-gate transistor being coupled to said first bit line, the floating gate of said second floating-gate transistor being coupled to said second bit line, the control gate of said first floating-gate transistor being connected to said second bit line and the control gate of said second floating-gate transistor being connected to said first bit line, wherein information stored in said cell is determined by detecting which of said memory transistors has a floating-gate in charged condition and which in uncharged condition, and application of a higher voltage on one of said bit lines and a lower voltage to the other of said bit lines causes one of said memory transistors to be in charged condition and the other of said memory transistors to be in uncharged condition.

2. The EEPROM cell of claim 1 wherein said memory transistors are MOS transistors.

3. The EEPROM cell of claim 1 wherein said first memory transistor becomes charged if said higher voltage is applied to said second bit line.

4. The EEPROM cell of claim 1 wherein said first bit line includes a first select transistor and said second bit line includes a second select transistor, the gates of said first and second select transistors are connected in common to a word line.

5. The EEPROM cell of claim 4 wherein the source of said first select transistor is connected to the drain of said first memory transistor and to the gate of said second memory transistor, and the source of said second select transistor is connected to the drain of said second memory transistor and the gate of said first memory transistor.

6. The EEPROM cell of claim 1 wherein each of said bit lines is grounded at one end.

7. The EEPROM cell of claim 1 wherein each of said memory transistors has two-level structure.

8. The EEPROM cell of claim 1 wherein each of said memory transistors has three-level structure.

9. The EEPROM cell of claim 1 further comprising a first cutoff transistor connected to said first bit line and having a control gate connected to the control gate of said first floating-gate transistor, and a second cutoff transistor connected to said second bit line and having a control gate connected to the control gate of said second floating-gate transistor.

* * * * *